(12) United States Patent
Tong

(10) Patent No.: US 9,865,783 B2
(45) Date of Patent: Jan. 9, 2018

(54) DISTRIBUTED BRAGG REFLECTOR ON AN ALUMINUM PACKAGE FOR AN LED

(71) Applicant: Luminus, Inc., Sunnyvale, CA (US)

(72) Inventor: Tao Tong, Fremont, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 14/339,446

(22) Filed: Jul. 23, 2014

(65) Prior Publication Data

US 2015/0069438 A1    Mar. 12, 2015

Related U.S. Application Data

(60) Provisional application No. 61/857,356, filed on Jul. 23, 2013.

(51) Int. Cl.
| | |
|---|---|
| *H01L 33/00* | (2010.01) |
| *H01L 33/60* | (2010.01) |
| *H01L 33/10* | (2010.01) |
| *H04L 27/26* | (2006.01) |
| *H04L 25/03* | (2006.01) |
| *H01L 25/075* | (2006.01) |

(52) U.S. Cl.
CPC ......... *H01L 33/60* (2013.01); *H01L 25/0753* (2013.01); *H01L 33/10* (2013.01); *H04L 25/03828* (2013.01); *H04L 27/2602* (2013.01); *H04L 27/263* (2013.01); *H04L 27/2614* (2013.01); *H04L 27/2626* (2013.01); *H01L 2924/0002* (2013.01); *H01L 2933/0033* (2013.01); *H01L 2933/0058* (2013.01)

(58) Field of Classification Search
CPC ..... H01L 33/60; H01L 25/0753; H01L 33/10; H01L 2924/0002; H01L 2933/0033; H01L 2933/0058; H04L 25/03828; H04L 27/2602; H04L 27/2614; H04L 27/2626
USPC ............................................................ 257/98
See application file for complete search history.

(56) References Cited

U.S. PATENT DOCUMENTS

| | | | |
|---|---|---|---|
| 2005/0151125 A1* | 7/2005 | Erchak ................... | H01L 33/20 257/13 |
| 2008/0142813 A1* | 6/2008 | Chang ................. | H01L 33/0079 257/77 |
| 2012/0002417 A1* | 1/2012 | Li ......................... | F21V 17/007 362/249.02 |
| 2012/0153313 A1* | 6/2012 | Yokotani ................ | H01L 33/62 257/88 |

(Continued)

*Primary Examiner* — Vu A Vu
(74) *Attorney, Agent, or Firm* — Wolf, Greenfield & Sacks, P.C.

(57) ABSTRACT

A light-emitting diode (LED) assembly includes an aluminum substrate, a silver layer, a distributed Bragg reflector (DBR) and an LED device. The aluminum substrate has a top surface whose length and width are each more than once centimeter. The silver layer is disposed over the entire top surface of the aluminum substrate. The DBR is disposed over the entire upper surface of the silver layer. The DBR includes an upper reflector layer and a lower reflector layer. The lower reflector layer contacts the upper surface of the silver layer. The Led device is attached to the upper reflector layer of the DBR, but the LED device is not disposed over the entire upper reflector layer. In one embodiment, the silver layer is deposited on the substrate using physical vapor deposition. In another embodiment, multiple pairs of lower reflector and higher reflector layers are included.

13 Claims, 4 Drawing Sheets

(56) References Cited

U.S. PATENT DOCUMENTS

2013/0058102 A1\* 3/2013 Lin ................. G02B 5/0833
                                                  362/296.04
2014/0246688 A1\* 9/2014 Dobner ............. H01L 33/60
                                                  257/88

\* cited by examiner

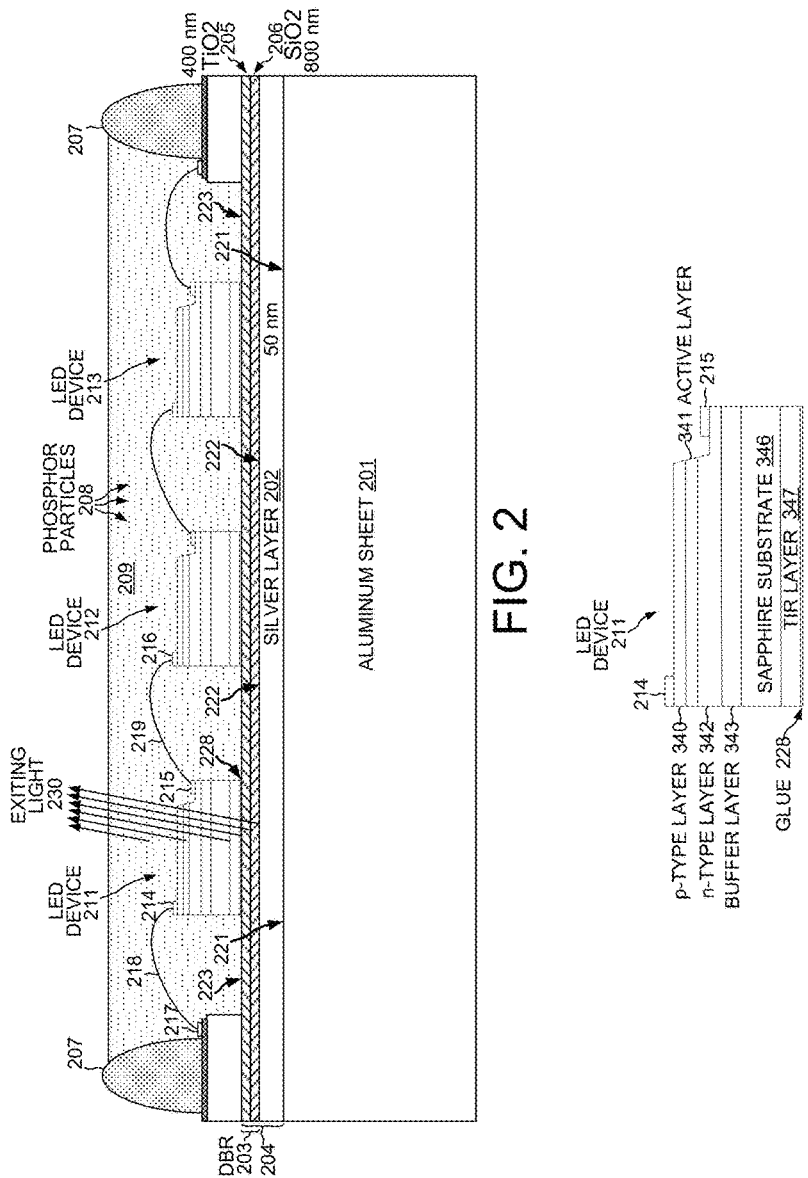

DISTRIBUTED BRAGG REFLECTOR ON AN ALUMINUM PACKAGE FOR AN LED

CROSS REFERENCE TO RELATED APPLICATIONS

This application claims priority under 35 U.S.C. §119 from U.S. Provisional Application No. 61/857,356, entitled "Distributed Bragg Reflector on an Aluminum Package for an LED" filed on Jul. 23, 2013; the subject matter of which is incorporated herein by reference.

TECHNICAL FIELD

The present invention relates generally to light-emitting diodes (LEDs) and, more particularly, to LEDs packaged on an aluminum sheet with a distributed Bragg reflector.

BACKGROUND INFORMATION

Development in light-emitting diode (LED) lighting technology continues to take place at a dramatic pace. LED chip makers have raised the luminous efficacy of LED components. One of the technology used inside the LED device is the distributed Bragg reflector (DBR). DBR increases the overall amount of light exiting the LED device.

In its simplest form, a distributed Bragg reflector is a quarter wave stack of dielectric materials. The materials from which the layers of the stack are made alternate from layer to layer down the stack. The materials are selected such that the alternating layers have a high index of refraction, then a low index of refraction, then a high index of refraction, and so forth down the stack. The distributed Bragg reflector is typically designed to maximize the reflection of a particular wavelength of light. The upper layer of the stack has a thickness of one quarter of the wavelength of light at the design wavelength of the distributed Bragg reflector. This wavelength is the wavelength of the light when the light is passing through the layer. The wavelength $\lambda$, frequency f, and speed of light (velocity v) is given by the equation $\lambda = v/f$. When light leaves one medium and enters another medium, the speed and wavelength of the light may change but the frequency does not change. The material from which the upper layer is made therefore determines the speed of light v in the medium. The material also influences the wavelength $\lambda$ of the light in the upper layer.

Each material has an index of refraction $\eta$. The index of refraction $\eta$ is the ratio of the speed of light in a vacuum to the speed of light in the medium. The wavelength of light in a medium is given by the equation $\lambda = \lambda o/\eta$, where $\lambda o$ is the wavelength in a vacuum. Light traveling through air is traveling at close to the speed of light in a vacuum, so the wavelength of light in air is close to wavelength of the light in a vacuum. The quarter wavelength of light through the medium of a layer is determined using the relationship $QWOT = \lambda o/4\eta$, where $\eta$ is the refractive index of the material from which the layer is made. In this way, the refractive indices of the materials of the various layers of the stack are used to determine how thick to make each layer of the stack so that the layer has a thickness of one quarter wavelength. The design wavelength $\lambda o$ for the distributed Bragg reflector is typically designed to be longer than the wavelength of the light emitted by the LED. For example, the optimal DBR design wavelength is around 510 nm for an LED that emits mostly blue light at 450 nm.

Light passes into the stack and through the upper layer, and then some of the light reflects off the interface between the upper layer and the next layer down in the stack. Part of the light proceeds down into the next layer of the stack to the next interface. If the interface is one from a low-index medium to a high-index medium, then any light reflected from the interface will be phase shifted by 180-degree. If, on the other hand, the interface is one from a high-index medium to a low-index medium, then any reflected light will have no phase shift. Each interface causes a partial reflection of the light wave passing into the stack. The phase shifts, in combination with the thicknesses of the layers of the stack, are such that the portions of light reflecting off interfaces all return to the upper surface of the stack in phase with each other. The multiple reflections off the interfaces all combine at the top of the stack with constructive interference. The result is that the Distributed Bragg Reflector has a high reflectivity within a finite spectral range known as the stop-band.

Though DBR increases the optical reflectivity, it is currently limited to the LED devices only. The LED packaging, however, does not take advantage of the DBR. In LED packaging, the LED device is directly placed on top of a metal substrate, coated with highly reflective metal layer. The reflective metal layer in a LED package is not optimized to reflect lights emitted from the LED devices. Further, the reflective metal layer is prone to environment degradation over time because the reflective layer is not protected.

A design for an LED packaging is sought that improves the reflectivity of the reflective layer and to protect the reflective layer from fast degradation.

SUMMARY

Method and apparatus are provided for an LED assembly. In one novel aspect, a DBR layer is included to form a high reflective layer for the LED assembly. The LED assembly includes an aluminum substrate, a silver layer, a distributed Bragg reflector (DBR) and an LED device. The aluminum substrate has a top surface whose length and width are each more than once centimeter. The silver layer is disposed over the entire top surface of the aluminum substrate. The DBR is disposed over the entire upper surface of the silver layer. The DBR includes an upper reflector layer and a lower reflector layer. The lower reflector layer contacts the upper surface of the silver layer. The Led device is attached to the upper reflector layer of the DBR, but the LED device is not disposed over the entire upper reflector layer.

In one embodiment, the silver layer is deposited on the substrate using physical vapor deposition. In another embodiment, multiple pairs of lower reflector and higher reflector layers are included to form the DBR layer.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2 is a simplified cross-sectional diagram of the LED assembly 100 as shown in FIG. 1, in accordance with one novel aspect.

FIG. 3 shows the exemplary structure of the LED devices of LED assembly 100 in more detail.

DETAILED DESCRIPTION

Reference will now be made in detail to some embodiments of the invention, examples of which are illustrated in the accompanying drawings.

Figure 1:
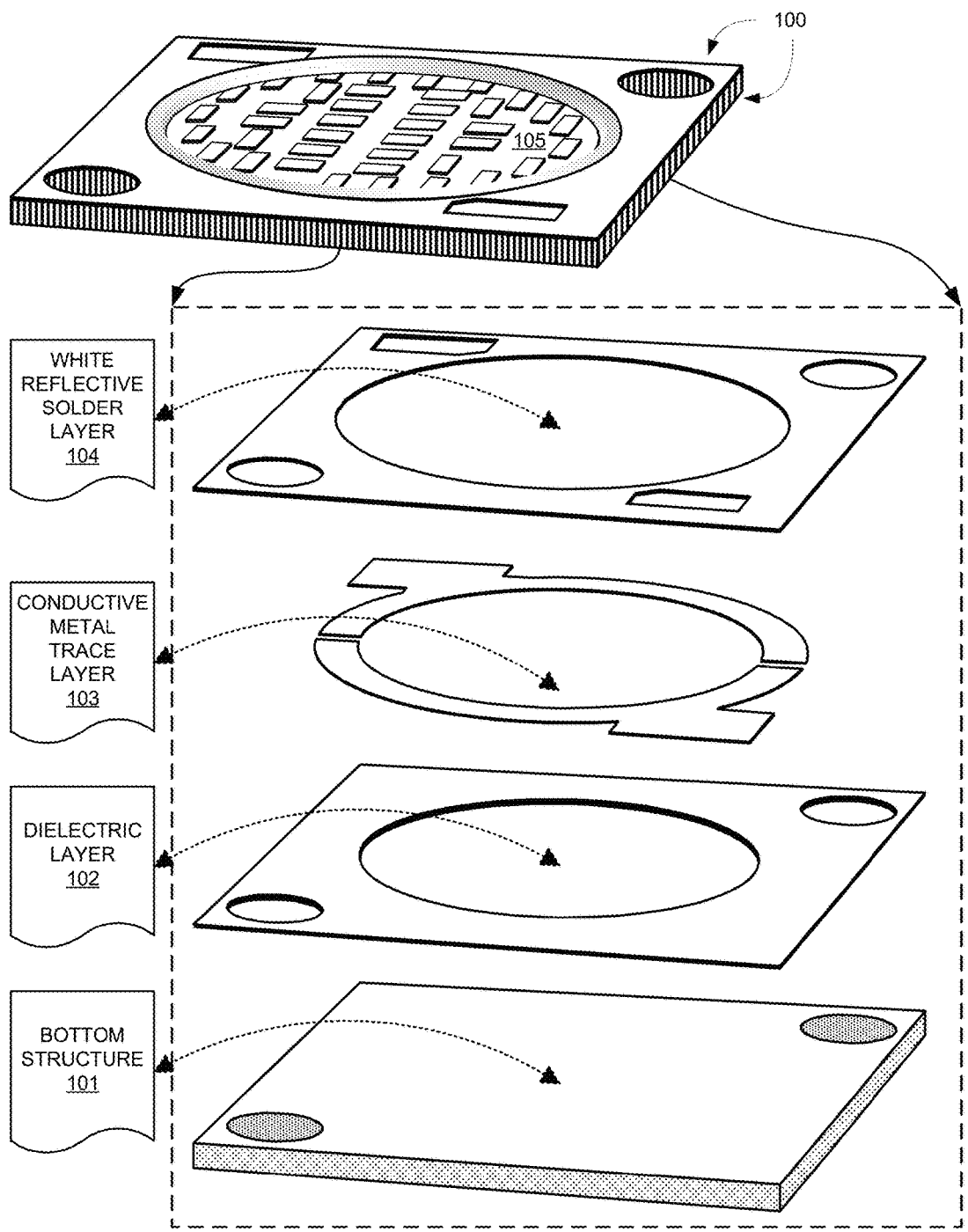
FIG. 1 is a perspective view of one embodiment of an LED assembly on which a Bragg reflector has been formed over a metal sheet.

FIG. 1 is a perspective view of one embodiment of an LED assembly 100 on which a Bragg reflector has been formed over a metal sheet. LED assembly 100 includes a bottom structure 101, a dielectric layer 102, a conductive metal trace layer 103, a white reflective solder layer 104 and multiple LED devices 105.

Bottom structure 101 has a substrate layer and a composite high reflection mirror layer. In one embodiment, the substrate layer of bottom structure 101 is an aluminum layer. A square is cut from the roll of aluminum sheet metal on which a high refection mirror layer is formed.

In one novel aspect, the high reflection mirror layer includes a silver layer deposited over the entire substrate layer using physical vapor deposition (PVD) coating technique, for example sputtering. Unlike plate coating used in traditional LED packaging, PVD coating provides better optical quality. Further, PVD coating, such as sputtering, operates in the purified vacuum environment and thus eliminates contamination in the process.

In another novel aspect, a dielectric coating is applied on top of the silver layer to enhance the total reflectance of light. The dielectric coatings form a DBR layer in bottom structure 101 for LED assembly 100. Accordingly, the dielectric coatings of high-index and low-index may be different materials. The high refractive index materials includes: $TiO_2$, $ZrO_2$, $ZnSe$, $Si_3N_4$, $Nb_2O_5$ or $Ta_2O_5$. Lower refractive index materials includes: $MgF_2$, $SiO_2$, $Al_2O_3$ or $CaF_2$. In one embodiment, only one pair of the dielectric coatings is used. In another embodiment, multiple pairs of such coating are used. The dielectric coating not only enhances the total reflectance of light, but also provides further protection for the metal reflective layer, such as the silver layer.

Non-transparent dielectric layer 102 is formed over bottom structure 101 to provide electrical isolation to the power contacts for LED assembly 100. Dielectric layer 102 has a thickness of 50-250 microns.

Conductive metal trace layer 103 is then formed over dielectric layer 102. In one embodiment, conductive metal trace layer 103 is formed from a copper sheet that is laminated as a lithography pattern over dielectric layer 102. Metal trace layer 103 is plated with a finishing metal layer, such as nickel, palladium or gold.

White reflective solder layer 104 is deposited over the conductive metal trace layer 103. White reflective solder layer 104 has a thickness of 25-50 microns.

LED devices 105 are mounted on bottom structure 101. In one embodiment, LED devices 105 are mounted using a die-attach adhesive to the upper surface bottom structure 101. In another embodiment, LED devices 105 are spaced apart from one another by more than half of their largest dimensions. For example, where each LED device occupies a 2 mm-by-4 mm rectangle on surface of bottom structure 101, there are more than two millimeters between each LED device in the long dimension. LED devices can be mounted in different ways. For example, forty LED devices can be mounted as illustrated in FIG. 1. In another example, a matrix of nine LED devices are included LED assembly 100. FIG. 2 illustrates a cross-section view of the three-by-three LED device configuration for LED assembly 100.

FIG. 2 is a simplified cross-sectional diagram of the LED assembly 100 as shown in FIG. 1, in accordance with one novel aspect. LED assembly 100 includes a plurality of LED devices 211, 212, and 213 mounted on a reflector structure 204 formed on an upper surface 221 of a metal substrate 201. In one embodiment, metal substrate 201 is a metal core printed circuit board (MCPCB) that includes a trace layer (not shown) over solid metal. The solid metal can be aluminum or copper. A dielectric layer is formed between the solid metal and the trace layer. And a solder mask layer covers all of the trace layer except for locations at which electrical contacts are made from the top of the MCPCB.

In another embodiment as shown in FIG. 2, metal substrate 201 is a sheet of solid metal, such as aluminum or copper. Dielectric and trace layers are formed over the reflector structure 204 on the metal sheet 201. The metal sheet 201 is relatively thick compared to the layers of the LED devices 211-213, which are made using semiconductor processes. The metal sheet 201 is at least 0.5 millimeters (500,000 nanometers) thick in order to maintain the structural integrity of LED assembly 100, whose length and width are both at least one centimeter. During the manufacturing process, the length of metal sheet 201 is at least one meter long. Typically, metal sheet 201 has a thickness between 0.7 mm and 1.0 mm. As is apparent, FIG. 2 is not drawn to scale.

Reflector structure 204 includes a reflective metal layer 202 and a Distributed Bragg Reflector (DBR) 203. Reflective metal layer 202 is formed from a reflective metal, such as aluminum, silver, platinum or nickel. Metal layer 202 is formed by physical vapor deposition over the entire upper surface 221 of metal substrate 201. Then periods of paired layers of DBR 203 are formed over metal layer 202. In the most basic embodiment, DBR 203 includes a single pair of layers, including an upper reflector layer 205 and a lower reflector layer 206. Upper reflector layer 205 is made of dielectric material with a high index of refraction, such as $TiO_2$, $ZrO_2$, $ZnSe$, $Si_3N_4$, $Nb_2O_5$ or $Ta_2O_5$. Lower reflector layer 206 is made of a dielectric material having a low index of refraction, such as $SiO_2$, $MgF_2$, $Al_2O_3$ or $CaF_2$. Lower reflector layer 206 is deposited over the upper surface 222 of reflective metal layer 202 and contacts both reflective metal layer 202 and upper reflector layer 205. The upper surface 223 of upper reflector layer 205 is the upper surface of reflector structure 204.

Reflector structure 204 is formed over entire upper surface 221 of metal substrate 201 in a continuous, in-line conveyor-belt process as opposed to in a semiconductor process performed in batches in a vacuum chamber. For example, the layers of reflector structure 204 can be formed by successively depositing the silver of metal layer 202, the silicon dioxide of lower reflector layer 206, and the titanium dioxide of upper reflector layer 205 at various stages along a continuous reel-to-reel process in which a long sheet of the metal substrate 201 is rolled out through the deposition stages and then rolled back up after the reflector structure 204 has been formed on upper surface 221. LED devices are then mounted on suitably sized pieces of the unrolled metal sheets that are cut from the large-diameter rolls of the reflector structure 204 formed on the metal substrate 201.

In the embodiment of FIG. 2, a three-by-three matrix of LED devices is mounted on a package formed from a piece of the unrolled metal sheet. FIG. 2 shows three 211-213 of the nine LED devices that are mounted on upper surface 223 of reflector structure 204. The LED devices are spaced apart from one another by more than half of their largest dimensions. For example, where each LED device occupies a 2 mm times 2 mm square on surface 223, there is more than one millimeter between LED device 211 and LED device 212 in the dimension shown in FIG. 2.

The nine LED devices of LED assembly 100 are electronically connected in series using wire bonding. FIG. 2 shows an exemplary connection along a bond wire 218 from a landing pad 217 at the periphery of LED assembly 100 to metal electrode 214 on the p-type layer of LED device 211. The connection is continued along bond wire 219 from metal electrode 215 on the n-type layer of LED device 211 to a metal electrode 216 on LED device 212.

The LED devices are surrounded by a ring 207 that forms a dam for holding a silicone slurry of phosphor particles. Ring 207 is formed from silicone. A slurry of phosphor particles 208 suspended in silicone 209 is then poured over the wire bonded LED devices and fills the ring 227. The silicone 209 with suspended phosphor particles 208 then hardens. The phosphor is evenly dispersed throughout the silicone 209 and converts a portion of the blue light emitted by the LED devices into light in the yellow and red regions of the optical spectrum. The blue light from the LEDs and the yellow and red light from the phosphor combine to yield white light. Only about 10% of the light exiting LED assembly 100 is blue light. The average wavelength of the exiting light 230 is about 550 nm.

The exiting light 230 is made up of many components, most of which are reflected and scattered several times. Half of the light emitted from the active layer of each LED device travels downward. This light, which in the present example has a wavelength of approximately 450 nm, is reflected back upward by the TIR layer and reflector structure 204. Some of this reflected light, as well as some of the other half of the blue light emitted from the active layer that travels upward, strikes phosphor particles and is primarily down-converted into light of longer wavelengths. Some of the blue light is also back-scattered by the phosphor particles and travels downward towards the LED device and reflector structure 204. The down-converted light has a wavelength in a range between 500 nm and 700 nm and is referred to simply as "yellow" light. The down-converted yellow light is emitted in all directions (isotropically). This down-converted yellow light together with the blue light emitted from the active layer, after partially making multiple bounces within LED assembly 100, exits the assembly as the exiting light 230 with an average wavelength of about 550 nm. The average wavelength of the light traveling downward is also 550 nm, so the thicknesses of upper reflector layer 205 and lower reflector layer 206 of DBR 203 are adjusted to reflect light with a wavelength of 550 nm.

FIG. 3 shows the exemplary structure of the LED devices of LED assembly 100 in more detail. For example, LED device 211 has an epitaxial region including a p-type layer 340, an active layer 341, an n-type layer 342, and a buffer layer 343. In operation, an electric field is generated between p-type layer 340 and n-type layer 342 by flowing a current between a metal electrode 214 on p-type layer 340 and a metal electrode 215 on n-type layer 342. N-type layer 342 has mainly electrons, and p-type layer 340 has mainly holes. The electric field causes the electrons and holes to move into active layer 341 and to combine, releasing energy in the form of light. In one implementation, the layers 340-342 are made of gallium nitride materials, and active layer 341 includes an amount of indium that allows the active layer to emit blue light over a bandwidth centered at approximately 450 nm. The epitaxial region is disposed on a substrate 346 made of a transparent material, such as sapphire, SiC, GaN or AlN.

A total internal reflection (TIR) layer 347 is formed under transparent substrate 346. TIR layer 347 is disposed on the backside of substrate 346, which is the opposite side of the substrate from the epitaxial region. TIR layer 347 is made of a dielectric material having a low index of refraction, such as $SiO_2$, $MgF_2$ and $CaF_2$. FIG. 2 shows that each of the LED devices 211-212 is attached to the upper surface 223 of reflector structure 204. In one embodiment, the bottom surface of TIR layer 347 is glued to the upper surface 223 of upper reflector layer 205 using a silicone gel glue 228. For example, the glue 228 has a thickness of 1000 to 3000 nanometers. Where TIR layer 347 is made of silicon dioxide, the index of refraction of TIR layer 347 nearly matches the index of refraction of glue 228 because silicon dioxide has an index of refraction of 1.45, and silicone gel has an index of refraction of 1.41.

Figure 4:
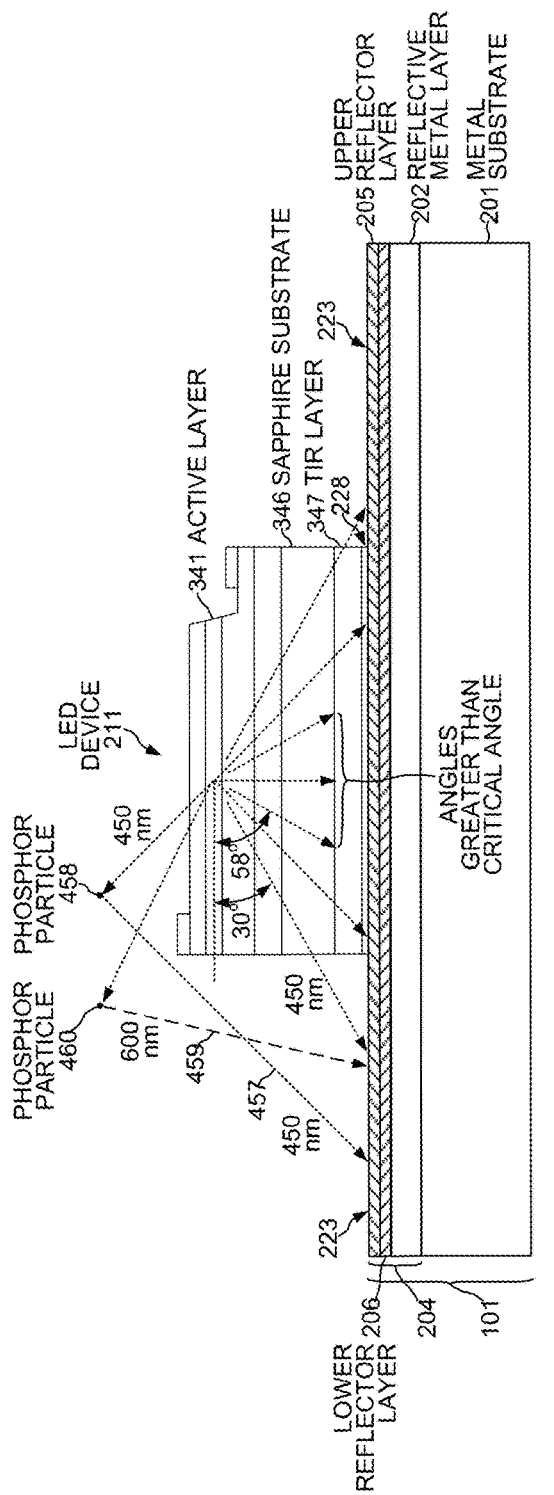
FIG. 4 is a diagram of LED device mounted on reflector structure illustrating how the various light rays traveling downwards are reflected from TIR layer, upper reflector layer, lower reflector layer and reflective metal layer.

FIG. 4 is a diagram of LED device 211 mounted on reflector structure 204 illustrating how the various light rays traveling downwards are reflected from TIR layer 347, upper reflector layer 205, lower reflector layer 206 and reflective metal layer 202. In one embodiment, TIR layer 347 is made of silicon dioxide, which has a lower index of refraction than does sapphire substrate 346. Silicon dioxide has an index of refraction of 1.45, whereas sapphire has an index of refraction of 1.76. Thus, according to Snell's law, TIR layer 347 at the bottom of LED device 211 reflects almost all of the light traveling downwards through sapphire substrate 346 at angles greater than the critical angle, in this case fifty-eight degrees. (Light traveling downward orthogonally to TIR layer 347 is oriented at ninety degrees.) For downward traveling light, there is little reflective benefit to the portion of reflector structure 204 situated below TIR layer 347 within the range of angles greater than the critical angle because almost all of the light has been reflected by TIR layer 347. A greater benefit of reflective metal layer 202 and DBR 203 is reflecting light traveling downward from active layer 341 at angles between zero degrees (a grazing angle) and fifty-eight degrees. The reflectivity of the structure of LED assembly 100 of FIG. 2 is superior to that of traditional LED assembly largely due to the improved reflectivity of the reflector structure 204 outside the lateral boundaries of the LED devices compared to the reflectivity of the upper surface of metal reflective layer only.

FIG. 4 illustrates that a large portion of the light traveling downward from active layer e41 at angles between 0-58 degrees will strike the upper surface 223 of reflector structure 204 outside the lateral boundaries of LED device 211. Forming reflective metal layer 202 and DBR layers 205-206 over the entire metal packaging sheet 201 improves the overall reflectance of LED assembly 100 by reflecting more of the light that strikes the packaging laterally outside the boundaries of the LED devices. In addition, the overall reflectance of LED assembly 100 is improved because reflector structure 204 better reflects (i) the blue light (about 450 nm wavelength) that is back-scattered between the LED devices as well as (ii) the yellow light (about 600 nm average wavelength) that strikes between the LED devices after it is emitted from phosphor particles that down-convert blue light. FIG. 4 shows such a ray of blue light 457 that is back-scattered from a phosphor particle 458 and a ray of yellow light 459 that is down-converted by a phosphor particle 460, both of which strike surface 223 of reflector structure 204 at locations between the LED devices.

Another advantage of placing DBR 203 and reflective metal layer 202 on metal substrate 201 instead of on the LED die is the lower manufacturing cost per unit area of reflective surface. For a unit of reflective surface produced, forming the DBR layers 205-206 and the reflective metal layer 202 using physical vapor deposition in an in-line, conveyor belt process is cheaper than forming the DBR layers and reflective metal layer using semiconductor processes. Further, DBR 203 provides protection again environmental degradation for the reflective layer, such as silver layer 202.

Figure 5:
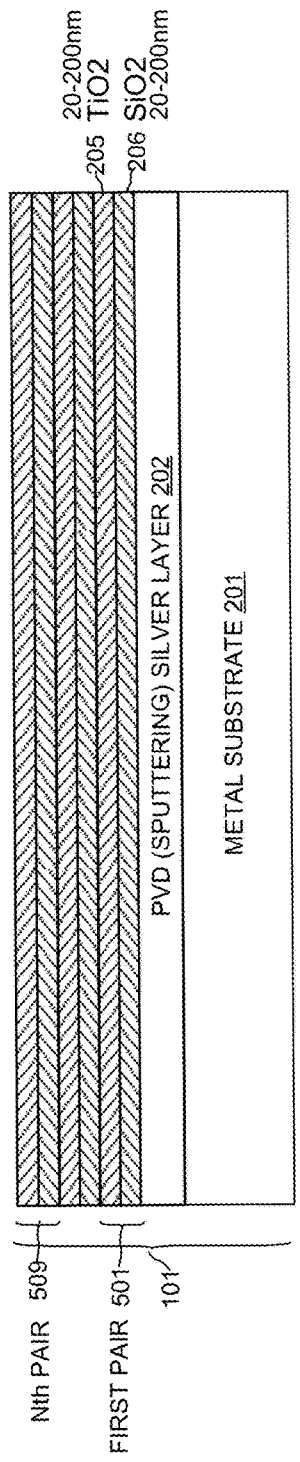
FIG. 5 is an expanded view of the bottom structure for the LED assembly with multiple pairs of DBR in accordance with embodiments of the current invention.

FIG. 5 is an expanded view of the bottom structure 101 for the LED assembly 100 with multiple pairs of DBR in accordance with embodiments of the current invention. Bottom structure 101 has a metal substrate layer 201, a PVD silver layer 202 and a DBR layer 203. In one embodiment, DBR layer 203 includes multiple pairs of high index of refraction material and low index of refraction material. For example, upper reflector layer 205 and lower reflector layer 206 forms the first pair 501. Multiple of such pairs are included in DBR layer 203. For example, DBR 203 further includes high-index and low-index dielectric pair 509.

The DBR layer covers the entire silver layer for the LED package. The DBR layer not only provides better reflectivity, but also provides the much needed protection to the silver layer. The silver layer, which is also called the reflective layer covers the entire substrate. In one novel aspect, physical vapor deposition (PVD), in this embodiment sputtering process, is used to deposit the silver layer. The silver layer has a thickness of around 100 nanometers. The aluminum base substrate has a thickness of more than 500,000 nanometers. It is understood by one of ordinary skills in the art that the LED package is optimized using the above dimensions but not limited to it.

In general, each of the upper reflector layer and the lower reflector layer has a thickness of less than 150 nanometers. Further, depending on the material chosen for the particularly layer, the thickness of each upper reflector layer and lower reflector layer is further optimized based on the material chosen. The optimization is done by choosing the best reflectivity for the pair of material chosen based on some predefined criteria. Such criteria may include increase the reflectivity for the main emission wavelength range of the LED package. It may also include increase the total reflectivity for certain wavelength. The optimization of the thickness of each layer of DBR further enhances the overall performance of the package.

Figure 6:
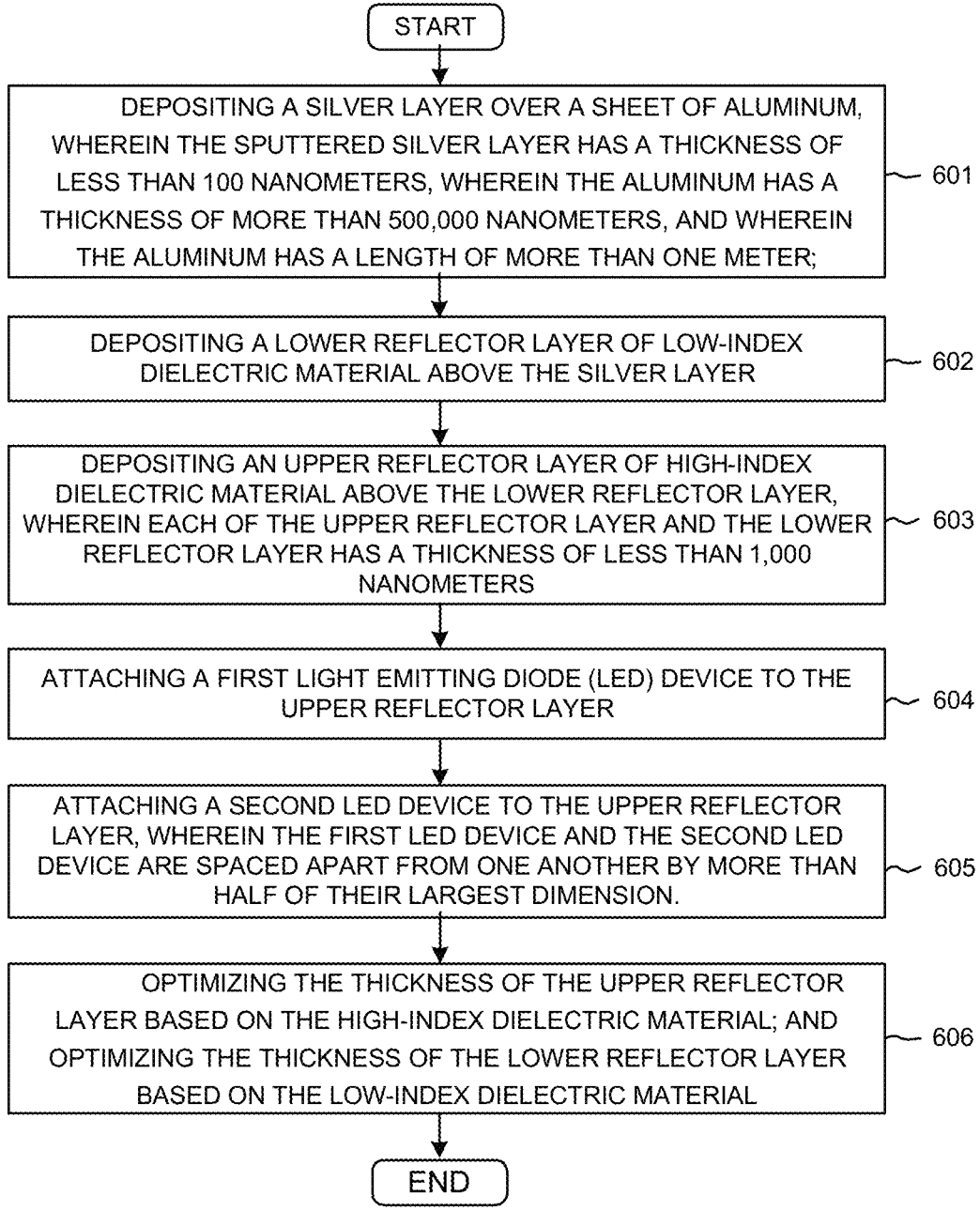
FIG. 6 a flowchart of a method for a LED package in accordance with one novel aspect.

FIG. 6 is a flowchart of a method for a LED package in accordance with one novel aspect. Step 601 deposits a silver layer over a sheet of aluminum, wherein the sputtered silver layer has a thickness of less than 100 nanometers, wherein the aluminum has a thickness of more than 500,000 nanometers, and wherein the aluminum has a length of more than one centimeter. Step 602 deposits a lower reflector layer of low-index dielectric material above the silver layer. Step 603 deposits an upper reflector layer of high-index dielectric material above the lower reflector layer, wherein each of the upper reflector layer and the lower reflector layer has a thickness of less than 1,000 nanometers. Step 604 attaches a first light emitting diode (LED) device to the upper reflector layer. Step 605 attaches a second LED device to the upper reflector layer, wherein the first LED device and the second LED device are spaced apart from one another by more than half of their largest dimension. Step 606 optimizes the thickness of the upper reflector layer based on the high-index dielectric material; and optimizing the thickness of the lower reflector layer based on the low-index dielectric material.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   an aluminum substrate having a top surface whose length and width are each more than one centimeter, wherein the aluminum substrate is an aluminum core printed circuit board;
   a silver layer covering the entire top surface of the aluminum substrate, wherein the silver layer has an upper surface;
   a distributed Bragg reflector (DBR) disposed over the entire upper surface of the silver layer, wherein the DBR includes an upper reflector layer and a lower reflector layer, and wherein the lower reflector layer contacts the upper surface of the silver layer; and
   a light emitting diode (LED) device that is attached to the upper reflector layer of the DBR.

2. The apparatus of claim 1, wherein the silver layer is deposited over the aluminum using physical vapor deposition.

3. The apparatus of claim 1, wherein the silver layer has a thickness of less than 200 nanometers.

4. The apparatus of claim 1, wherein the LED device is not disposed over the entire upper reflector layer.

5. The apparatus of claim 1, wherein the LED has a sapphire substrate adjacent to a total internal reflection (TIR) layer, and wherein the TIR layer is attached to the upper reflector layer of the DBR.

6. The apparatus of claim 5, wherein the TIR layer is attached to the upper reflector layer by silicone glue.

7. The apparatus of claim 5, wherein the TIR layer is composed of a low-index dielectric material taken from the group consisting of: $SiO_2$, $MgF_2$, $Al_2O_3$ and $CaF$.

8. The apparatus of claim 1, wherein the upper reflector layer is made of a high-index dielectric material taken from the group consisting of: $TiO_2$, $ZrO_2$, $ZnSe$, $Si_3N_4$, $Nb_2O_5$ and $Ta_2O_5$, and wherein the lower reflector layer is made of a low-index dielectric material taken from the group consisting of: $SiO_2$, $MgF_2$, $Al_2O_3$ and $CaF_2$.

9. The apparatus of claim 8, wherein a thickness of the upper reflector layer is optimized based on the high-index dielectric material chosen, and wherein a thickness of the lower reflector layer is optimized based on the low-index dielectric material chosen.

10. The apparatus of claim 9, wherein the thickness of the upper reflector layer has a thickness in the range between 20-150 nm, and wherein the lower reflector layer has a thickness in the range of 20-150 nm.

11. The apparatus of claim 1, wherein the aluminum substrate has a thickness of more than 500,000 nanometers.

12. The apparatus of claim 1, wherein each of the upper reflector layer and the lower reflector layer has a thickness of less than 200 nanometers.

13. The apparatus of claim 1, wherein the DBR includes a plurality of reflector layers between the upper reflector layer and the lower reflector layer.

\* \* \* \* \*